United States Patent [19]
Sasaki

[11] Patent Number: 4,634,985
[45] Date of Patent: Jan. 6, 1987

[54] TIME-INTERVAL SIGNAL GENERATING APPARATUS

[75] Inventor: Shoji Sasaki, Tochigi, Japan

[73] Assignee: Fuji Electric Co., Ltd., Japan

[21] Appl. No.: 706,157

[22] Filed: Feb. 27, 1985

[30] Foreign Application Priority Data

May 24, 1984 [JP] Japan ................... 59-105327

[51] Int. Cl.⁴ ............................... G01R 29/02
[52] U.S. Cl. ..................... 328/129.1; 377/39
[58] Field of Search .............. 328/129.1; 377/39, 42, 377/49, 107; 307/234, 269, 590, 600

[56] References Cited

U.S. PATENT DOCUMENTS

| | | | |
|---|---|---|---|
| 2,251,763 | 8/1941 | Schoene | 328/129.1 |
| 2,337,905 | 12/1943 | Livingston | 328/129.1 |
| 3,207,926 | 9/1965 | Schmader | 328/129.1 |
| 3,337,722 | 8/1967 | Siess et al. | 377/39 |
| 3,560,863 | 2/1971 | Baumdel | 328/129.1 |

FOREIGN PATENT DOCUMENTS 104279  8/1979  Japan ................... 328/129

OTHER PUBLICATIONS

Motorola CMOS Integrated Circuits, Series C, Motorola, Inc., 1978, previous edition 1976, prepared by Technical Information Center.

Primary Examiner—John S. Heyman
Assistant Examiner—Karl Ohralik
Attorney, Agent, or Firm—Brumbaugh, Graves, Donohue & Raymond

[57] ABSTRACT

In the particular embodiment of the invention described in the specification, a variable resistor is connected in potentiometer fashion to a DC power source and a time interval is selected according to the position of the movable contact. The ratio of the partial voltage provided by the movable contact to the full voltage applied to the resistor is determined and an oscillator signal target count for the selected time interval is computed from a count corresponding to the total voltage. The arrangement permits accurate time interval determination which is independent of variations in the supply voltage, variations in resistance value of the variable resistor, or environmental changes.

3 Claims, 6 Drawing Figures

TIME-INTERVAL SIGNAL GENERATING APPARATUS

BACKGROUND OF THE INVENTION

The present invention relates to a controllable time-interval signal generating apparatus for an electronic timer.

Heretofore, a relaxation oscillator has frequently been employed as the time-interval signal generating apparatus for an electronic timer. In such relaxation oscillators a variable resistor and a capacitor form a relaxation oscillator circuit. The frequency of a signal generated by the relaxation oscillator circuit is then stepped down by a frequency divider and the number of pulses is counted by a preset counter. The preset counter, which has been set beforehand, is adapted to generate a time-interval signal when a predetermined number of pulses has been counted.

In this type of conventional time-interval signal generating apparatus, a time interval is obtained which is related to the resistance value and the electrostatic capacitance of the relaxation oscillator circuit. Therefore, the time interval is adjusted by varying the resistance value of the variable resistor. Although such a conventional time-interval signal generating apparatus is simple in construction and easy to handle, the oscillation frequency may vary undesirably with changes in the resistance value of the resistor due to a temperature or humidity change or with a change in supply voltage. Such changes, in turn, cause variations in the time interval when the signal is generated.

Further, such conventional time-interval signal generators which use the same circuit may produce differences in time intervals due to variations in the actual resistance or electrostatic capacitance of the components used in the circuit from the nominal values for those components. For this reason, in order to obtain an accurate time interval signal, it is necessary to hold the supply voltage constant and to employ a variable resistor and a capacitor having a high precision in value. In addition, a fine-adjustment circuit for correcting the above-described variations is required, which is an additional disadvantage.

Accordingly, a primary object of the present invention is to provide a time-interval signal generating apparatus capable of producing an accurate time interval signal which is independent of fluctuations in control power supply voltage, or variations in the characteristics of the circuit elements, or environmental changes.

SUMMARY OF THE INVENTION

These and other objects of the invention are attained by providing a time-interval signal generating apparatus which includes a voltage divider arranged so that a variable resistor is connected to a DC power source, and the total voltage applied to the variable resistor corresponds to a maximum time interval. In this apparatus a required time interval is selected by adjusting the variable contact of the variable resistor to provide a partial voltage. The apparatus further includes a time-interval determination device which makes a comparison between the partial voltage and the total voltage to determine a set time interval, a target count determination device, a count signal generator which generates count signals at a predetermined rate, and a time-interval signal generator which counts the number of count signals generated by the count signal generator and makes a comparison between the count signals generated and the count corresponding to the selected time interval.

BRIEF DESCRIPTION OF THE DRAWINGS

Further objects and advantages of the invention will be apparent from a reading of the following description in connection with the accompanying drawings, in which.

DESCRIPTION OF PREFERRED EMBODIMENTS

Figure 6:
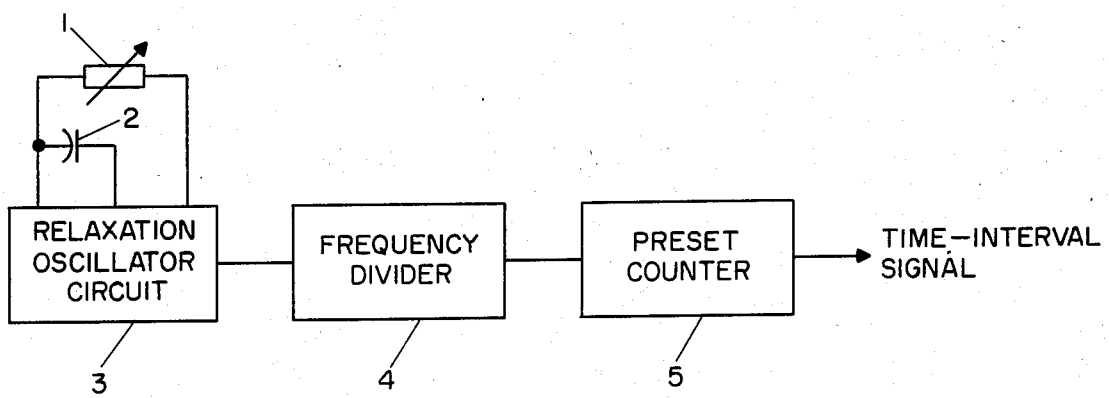
FIG. 6 is a schematic block diagram of an example of a conventional time-interval generating apparatus.

A typical prior art relaxation oscillator is shown in FIG. 6. In that oscillator, a variable resistor 1 and a capacitor 2 are components of a relaxation oscillator circuit 3. A frequency divider 4 steps down the frequency of pulses produced by the oscillator 3 and supplies them to a preset counter 5 which generates a time interval signal after a selected number of the pulses have been received. As previously mentioned, such systems are sensitive to variations in supply voltage, component values, and environmental conditions.

Figure 1:
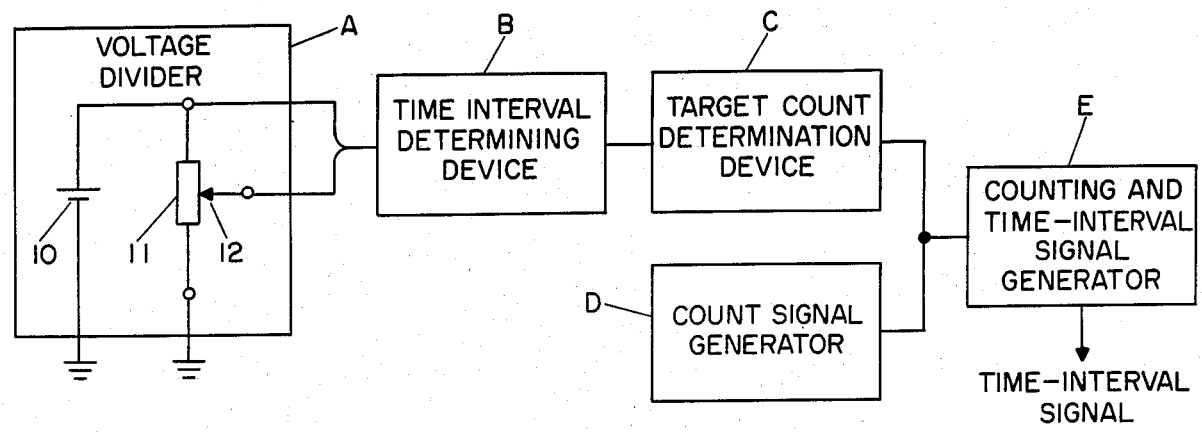
FIG. 1 is a schematic functional block diagram illustrating the overall arrangement of a representative embodiment of a time-interval generating apparatus in accordance with the present invention.

In FIG. 1, which is a functional block diagram showing the principle of the present invention, a voltage divider A includes a potentiometer in which a variable resistor 11 having a sliding contact 12 is connected to a DC power source 10. In the voltage divider A, the total voltage applied to the variable resistor 11 corresponds to a maximum time interval, and a partial voltage corresponding to a required time interval which is shorter than the maximum time interval is set by the sliding contact 12. A time-interval determination device B makes a comparison between the partial voltage and the total voltage to determine a set time interval. On the basis of the determined set time interval, a target count determination device C determines a target count.

In addition, count signals are generated at a predetermined rate by a count signal generator D and the number of count signals is counted by a time-interval signal generator E. When the target count is reached, the time-interval signal generator E generates a count end signal, that is, a time-interval signal. Because the ratio between the partial voltage obtained by connecting the variable resistor 11 in a potentiometer fashion and the total voltage applied to the variable resistor 11 is affected very little by fluctuations in voltage of the power supply, variations in the resistance value, or changes in the environment, the time interval is accurately reflected by the voltage-dividing ratio in accordance with the present invention.

It is to be noted that varying the rate at which count signals are generated by the count signal generator D makes it possible to change the maximum time interval and to obtain any required time interval which is equal to or lower than such maximum time interval. Further, the invention makes it possible to change the set time interval in the course of counting the same. This is done by arranging the time-interval generating apparatus so that the voltage divided by the voltage divider means is monitored until the target count is reached by counting in the time-interval signal generator E and if the partial voltage is changed, the operation is returned to the determination of the set time interval.

A representative embodiment of the present invention will be described in detail hereinafter with reference to the schematic diagram shown in FIG. 2. In that diagram, a DC power source 10 provides a total voltage $V_0$, and a variable resistor 11 having a slider 12 is connected to the DC power source 10 in potentiometer fashion. The total voltage $V_0$ of the DC power source 10 is applied across the variable resistor 11. Further, the variable resistor 11 is provided with a time-interval graduation in which the maximum time interval is represented by the distance between both ends of the variable resistor 11. A multiplexer 13 supplies multiple signals representing the total voltage $V_0$ across the voltage resistor 11 and the partial voltage $V_1$ obtained from the slider 12 to an A/D converter 14 in which they are converted to their respective digital voltage values.

A crystal oscillator 15 generates count signals at a stable rate and a microcomputer 16, which includes a CPU and a RAM, is coupled to the A/D converter 14 and the oscillator 15. The CPU controls the multiplexer 13 and the A/D converter 14 and determines a ratio k between a digital value $N_1$ corresponding to the partial voltage $V_1$ and a total-voltage digital value $N_0$ corresponding to the total voltage $V_0$, which are delivered from the A/D converter 14. The CPU further produces a target count C, which is equal to k·M, from a count M corresponding to the maximum time interval set on the variable resistor 11 and the RAM stores this count. The microcomputer 16 functions as a preset counter that counts the number of count signals generated by the oscillator 15 and generates a count end signal, that is, a time-interval signal when the count reaches the target count.

Figure 3:
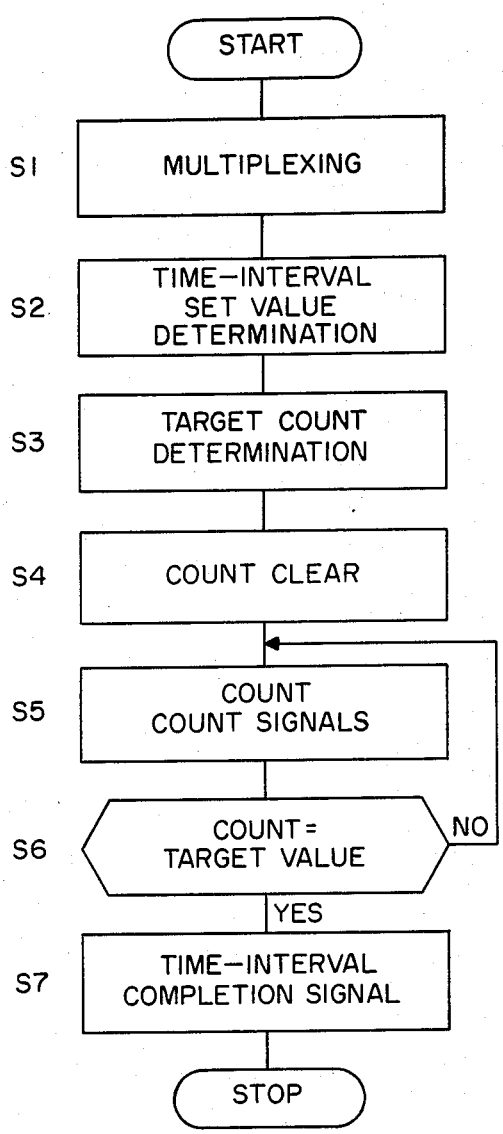
FIGS. 3 and 4 are flow charts showing different modes of operation of the time-interval generating apparatus shown in FIG. 2.

The operation of the time-interval generating apparatus in accordance with this embodiment will be explained with reference to a flow chart shown in FIG. 3. In that flow chart, each reference numeral with a prefix S denotes the step number of each step in the chart. In this time-interval generating apparatus, the slider 12 of the variable resistor 11 is set to a position corresponding to a required time interval. The microcomputer 16 then applies a control signal to the multiplexer 13 so that multiplex signals corresponding to the total voltage $V_0$ applied to the variable resistor 11 and the partial voltage $V_1$ obtained from the slider 12 and are applied to the A/D converter 14 (Step S1). The A/D converter 14 converts the total voltage $V_0$ into a total-voltage digital value $N_0$ corresponding to the voltage $V_0$ and the partial voltage $V_1$ into a partial voltage digital value $N_1$ corresponding to the voltage $V_1$ and the microcomputer 16 divides the partial voltage digital value $N_1$ by the total-voltage digital value $N_0$ and obtains a ratio $k=N_1/N_0$. This determines the time-interval value set by the variable resistor 11 (Step S2) and a target count C is computed according to the relation C=k·M, where M represents a maximum count corresponding to a maximum time interval represented by the voltage $V_0$ (Step S3).

At this point, the count measured for the time interval in the previous operation is cleared (Step S4). Threafter the number of count signals generated by the oscillator 15 is continuously counted (Step S5) and a determination is made as to whether or not the count has reached the target value (Step S6). If the answer is NO, counting is continued, and if the answer is YES, a count end signal, that is, a time-interval signal, is delivered (Step S7) and the operation of the apparatus is terminated.

It is to be noted that, in this apparatus, varying the oscillation period of the oscillator permits the maximum time interval to be changed with respect to the same maximum count M, so that it is possible to change the set time interval with the same target count.

Figure 2:
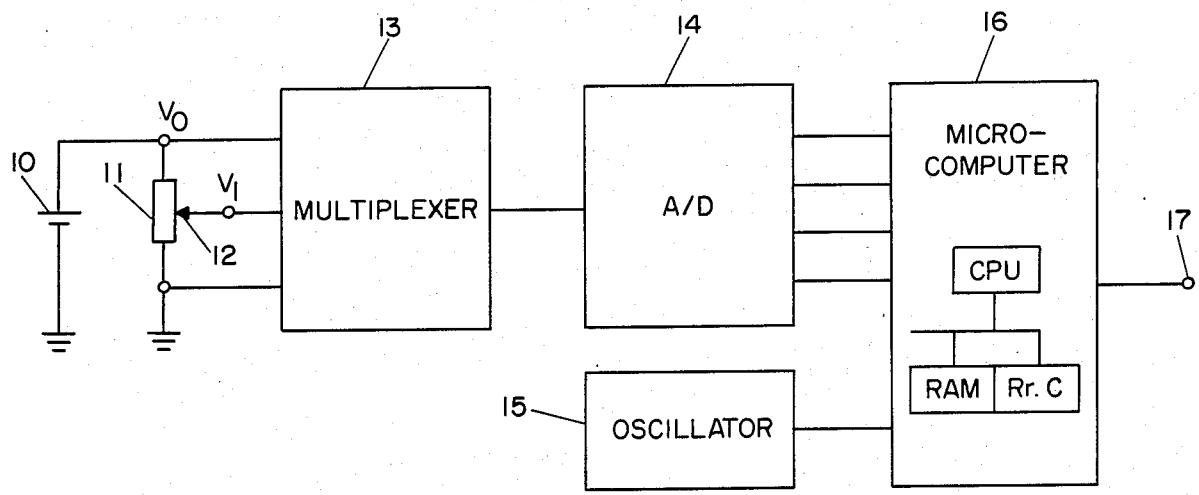
FIG. 2 is a schematic block diagram showing one embodiment of a time-interval generating apparatus in accordance with the present invention.
Figure 4:
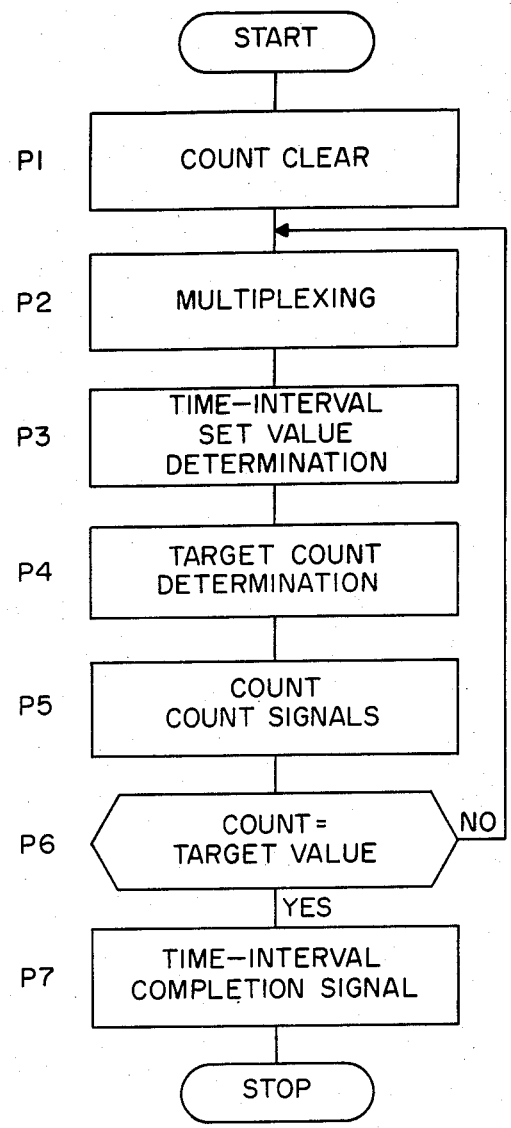

FIG. 4 is a flow chart showing another example of the operation of the time-interval generating apparatus of FIG. 2. Each reference numeral in FIG. 4 with a prefix P denotes the step number of each step in the flow chart. In this case also, as a matter of course, the slider 12 is set to a required time interval, similarly to the operation according to the flow chart shown in FIG. 3. The microcomputer 16 first clears the count for the previous operation (Step P1). Thereafter, similarly to the operation according to the flow chart shown in FIG. 3, the microcomputer 16 applies a control signal to the multiplexer 13 so that muliplex signals corresponding to the total voltage $V_0$ and the partial voltage $V_1$ are applied to the A/D converter 14. The A/D converter 14 converts the total voltage $V_0$ into a total-voltage digital value $N_0$ and the partial voltage $V_1$ into a partial voltage digital value $N_1$. The computer 16 divides the partial voltage digital value $N_1$ by the total-voltage digital value $N_0$ and obtains a ratio $k=N_1/N_0$ to determine the time interval set on the variable resistor 11 (Step P3). The computer 16 further determines a target count C=k·M from a maximum time interval M corresponding to a ratio k=1 which is set beforehand (Step P4).

Next, the count signals are counted (Step P5) and the computer 16 makes a determination as to whether or not the count has reached the target value (Step P6). If the answer is YES, a time-interval signal is delivered (Step P7), and the operation is stopped; and if the answer is NO, the operation is returned back to Step P2, which is different from the operation shown in the flow chart of FIG. 3. A control signal is then applied to the multiplexer 12 so that signals corresponding to the total voltage $V_0$ and the partial voltage $V_1$ are again supplied to the microcomputer which makes a time-interval set value determination (Step P3). Thereafter, Steps P4 and P5 are repeated and another determination is made as to whether or not the count has reached the target value. This operation is repeated until the count reaches the target value.

In this type of operation, whenever it is determined in Step P6 that the count has not yet reached the target value, the operation is repeated from Step P2. Therefore, if the position of the slider of the variable resistor is moved in the apparatus shown in FIG. 3 in order to change the time interval while the computer is counting the number of count signals generated by the oscillator, the newly set time-interval value is determined, and the counting is continued toward a new target value. This makes it possible to change the time interval during operation.

Figure 5:
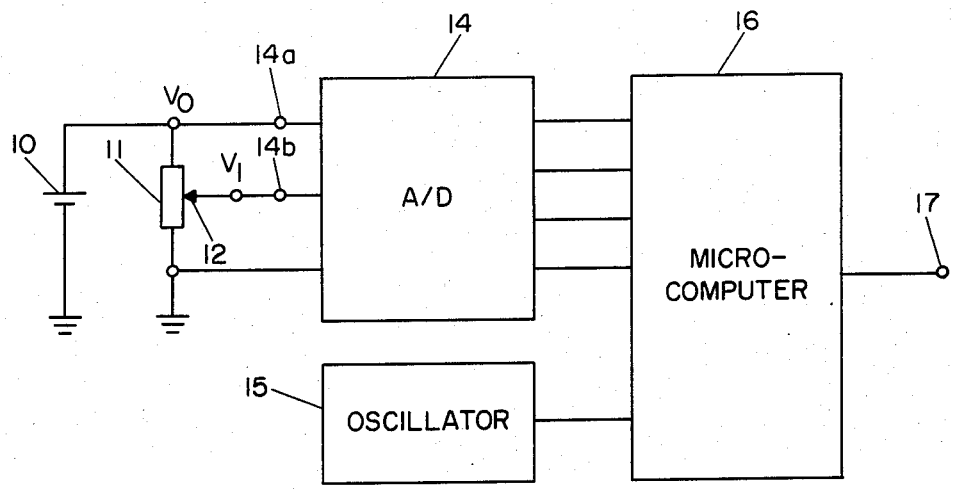
FIG. 5 is a schematic block diagram showing another embodiment of the present invention which is different from that shown in FIG. 2.

FIG. 5 shows another embodiment of the present invention, which is similar to the embodiment shown in FIG. 2 in that the variable resistor 11 is connected to the DC power source 10 in potentiometer fashion. In this embodiment, however, the total voltage $V_0$ and the partial voltage $V_1$ from the variable resistor 11 are both directly applied to the A/D converter 14, the total voltage $V_0$ being applied to a reference voltage terminal 14a and the partial voltage $V_1$ being applied to an input terminal 14b. In addition, this A/D converter 14 is different from that shown in FIG. 2 in that this A/D converter 14 not only has the reference voltage terminal 14a and the input terminal 14b but also is able to convert the analog voltages applied to those terminals into digital values and to obtain the ratio therebetween. Accordingly, it is possible to obtain the ratio k easily by applying the total voltage $V_0$ and the partial voltage $V_1$ from the variable resistor 11 to the reference voltage terminal 14a and the input terminal 14b. This arrangement eliminates the need for provision of a multiplexer and for obtaining the voltage dividing ratio k by the microcomputer 16. Since the other elements of FIG. 5, such as the microcomputer 16 and the oscillator 15, and their relation are the same as those in FIG. 2, the description of them is omitted. The operation of the embodiment of FIG. 5 is the same as those shown in the flow charts of FIGS. 3 and 4 except that, when the operation is carried out according to the flow chart of FIG. 3, the multiplexing in Step S1 is omitted, while according to the flow chart of FIG. 4, the multiplexing in Step P2 is omitted.

I claim:

1. Time-interval generating apparatus comprising voltage divider means including a variable resistor connected as a potentiometer to a DC power source, the total voltage applied to the variable resistor corresponding to maximum time interval and a selected time interval corresponding to a partial voltage obtained from a movable contact of the variable resistor, time-interval determining means for comparing the partial voltage and the total voltage to determine a set time interval proportional to a ratio of said voltages, target count determination means for determining a target count on the basis of the ratio determined by the time-interval determination means, count signal generator means for generating count signals at a predetermined rate, and time-interval signal generator means for counting the number of count signals generated by the count signal generator means and comparing the obtained count and the target count.

2. Time-interval generating apparatus according to claim 1 wherein the maximum time interval is changed by varying the rate at which the count signals are generated by the count signal generator means.

3. A time-interval generating apparatus according to either one of claims 1 and 2 including means for monitoring the partial voltage provided by the voltage divider means until a time-interval signal is provided by the time-interval signal generator means.

* * * * *